United States Patent [19]

Iizuka et al.

[11] Patent Number: 5,694,360
[45] Date of Patent: Dec. 2, 1997

[54] WRITE TO FLASH EEPROM BUILT IN MICROCOMPUTER

[75] Inventors: Yuichi Iizuka, Tokyo; Hiroshi Hikichi, Kawasaki, both of Japan

[73] Assignee: NEC Corporation, Tokyo, Japan

[21] Appl. No.: 589,909

[22] Filed: Jan. 23, 1996

[30] Foreign Application Priority Data

Jan. 23, 1995 [JP] Japan ................. 7-007880

[51] Int. Cl.[6] ............................... G11C 16/06
[52] U.S. Cl. .................. 365/185.33; 365/185.18; 365/189.09; 365/226
[58] Field of Search ............... 365/185.33, 226, 365/189.09, 189.11, 185.18, 185.23

[56] References Cited

U.S. PATENT DOCUMENTS 5,329,491   7/1994   Brown et al. ................ 365/226

Primary Examiner—Joseph A. Popek
Attorney, Agent, or Firm—Foley & Lardner

[57] ABSTRACT

In a data write apparatus to a flash electrically erasable programmable read only memory (EEPROM) built in a microcomputer which is mounted on a circuit board, a write control section first initializes the flash EEPROM to allow data to be written in the flash EEPROM, and supplies a signal indicative of the data for the flash EEPROM. A level converting section convertes a level of the data signal such that the data signal level matches to an actual operation voltage level of the flash EEPROM and supplies the converted data signal to the flash EEPROM such that the data is written in the flash EEPROM.

11 Claims, 3 Drawing Sheets

WRITE TO FLASH EEPROM BUILT IN MICROCOMPUTER

BACKGROUND OF THE INVENTION

1. Field of the Invention

The present invention relates to a write apparatus for writing to an electrically erasable programmable read only memory (EEPROM) built in a microcomputer board which is mounted on a circuit board.

2. Description of Related Art

Unlike a UVPROM which needs to be demounted from a circuit board for erasure by ultraviolet light and write by a PROM writer, EEPROM can be erased and written in the state in which the EEPROM is mounted on a user circuit board. Thereby, it is made possible to cope with a software bug in a manufacturing process, to write different software for every shipping destination, and to rewrite a data table. Further, the EEPROM does not need to be demounted from the print circuit board for debugging a software program stored therein.

An on-board write apparatus is used to rewrite a flash EEPROM built in a microcomputer mounted on a user board. For example, FIG. 1 is a block diagram of a conventional on-board write apparatus and a user system. Referring to FIG. 1, the on-board write apparatus is composed of an interface section 104 and a host section 106 including a host computer (not shown). The interface section 104 is composed of power supply units 142 and 144, a communication interface circuit 146, a memory 148, and a control section 150. The power supply unit 142 supplies a power supply voltage $V_{DD2}$ of 5 V to the communication interface circuit 146, the memory 148, and the control section 150. The power supply unit 144 supplies a power supply voltage $V_{PP}$ of 12 V.

The user board 102 is composed of a microcomputer 112 including a CPU 112-1 and flash EEPROM 112-2, a system power supply unit 114, a switch 118, and a user control target circuit 116 which is a circuit to be controlled by the microcomputer 112 based on a program stored in the flash EEPROM 112-2. The system power supply unit 114 generates a power supply voltage $V_{DD1}$ having an arbitrary value in a range of 2 V to 5.5 V and supplies power to the user control target circuit 116 and the switch 118. Also, the voltage VDD2 is supplied to the switch 118. Either the voltage $V_{DD1}$ or $V_{DD2}$ is selected by the switch 118 to be supplied to the microcomputer 112. In a normal operation, the switch 118 is operated to supply the voltage $V_{DD1}$ to the microcomputer 112.

On the other hand, in a data rewrite operation to the flash EEPROM 112-2, the switch 118 is operated to supply the voltage $V_{DD2}$ from the interface section 104 to the microcomputer 112. The control section 150 communicates with the host section 106 via a terminal 164 and the communication interface circuit 146 to control the memory 148. In addition, the control section 150 controls the flash EEPROM 112-2 via the terminals 162 and 128 and performs the setting of a write mode or a read mode, and the write and read operation.

Recently, the microcomputer has been reduced in size since it must be mounted in a small handy type of equipment. Also, the microcomputer needs to operate with a low system power supply voltage of 2 V to 3 V, which is different from the power supply voltage of the conventional on-board write apparatus. For this reason, in rewriting the flash EEPROM in the state in which the microcomputer is mounted, the supply voltage is switched by the switch 118. For this reason, the switch 118 prevents the user board from being made small. In addition, a latch-up phenomenon is caused due to a voltage difference between the microcomputer 112 and the user control target circuit 116, resulting in possible damage to the user board.

SUMMARY OF THE INVENTION

An object of the present invention is to provide a method for writing data in a flash EEPROM built in a microcomputer which is mounted on a user board with high reliability and an on-board write apparatus for realizing the method with a low cost.

In order to achieve an aspect of the present invention, an apparatus for writing data into a flash electrically erasable programmable read only memory (EEPROM) built in a microcomputer which is mounted on a circuit board, includes a write control section for initializing the flash EEPROM to allow data to be written in the flash EEPROM, and for supplying a signal indicative of the data for the flash EEPROM, and a level converting section for converting a level of the data signal such that the data signal level matches to an actual operation voltage level of the flash EEPROM and supplying the converted data signal to the flash EEPROM such that the data is written in the flash EEPROM. In this case, the write apparatus includes a first power supply unit for supplying a first voltage to the write control section and the level converting section, the write control section supplying the data signal formed based on the first voltage. Also, a system power supply unit for supplying a second voltage as the actual operation voltage different from the first voltage is further mounted on the circuit board. The level converting section converts the data signal level based on the first and second voltages such that the converted data signal has the voltage level matching to the second voltage level.

The level converting section includes at least two level converting elements, one being for transferring the data signal and the other being for transferring a clock signal, the data being written in the flash EEPROM in accordance with the clock signal. Each of the level converting elements may include an inverter for inverting the data signal with the same amplitude and an RS flip-flop for converting the inverted data signal into the data signal with the voltage level matching to the actual operation voltage level of the flash EEPROM. Alternatively, each of the level converting elements may include a three-state buffer circuit for outputting the data signal to the microcomputer in accordance with the control signal.

In order to achieve another aspect of the present invention, a method of writing data into a flash electrically erasable programmable read only memory (EEPROM) built in a microcomputer which is mounted on a circuit board, includes the steps of:

supplying first and second voltages to the microcomputer, the second voltage being generated in the circuit board;

supplying the second voltage to a level converting section of a data write apparatus;

initializing the flash EEPROM to allow data to be written in the flash EEPROM;

generating a signal indicative of the data for the flash EEPROM based on a third voltage; and in the level converting section, converting a level of the data signal from the third voltage level to the second voltage level to write the data in the flash EEPROM.

DESCRIPTION OF THE PREFERRED EMBODIMENTS

The on-board write apparatus according to an embodiment of the present invention will be described below with the accompanying drawings.

Figure 1:
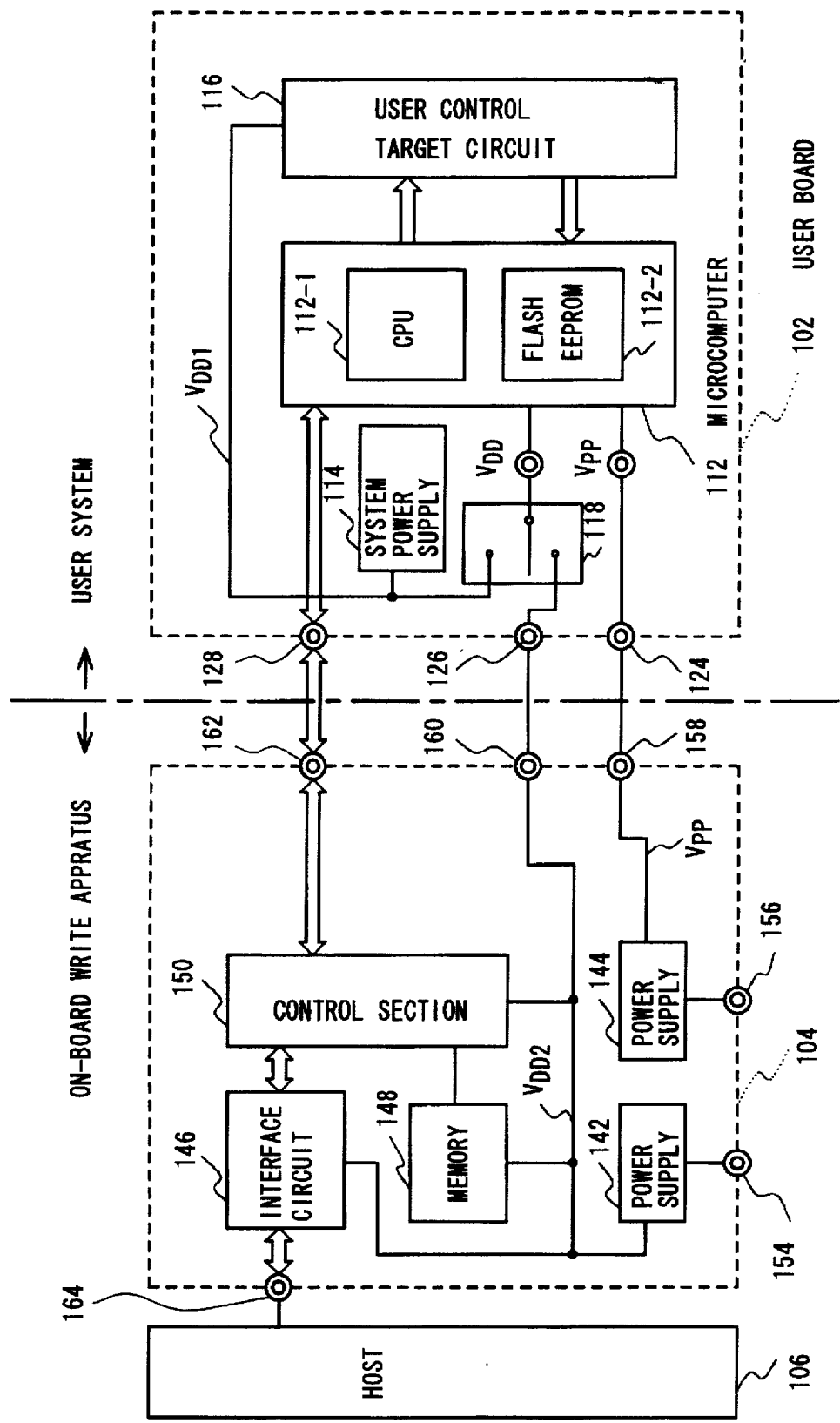
FIG. 1 is a block diagram of a conventional on-board write apparatus to a user microcomputer board.
Figure 2:
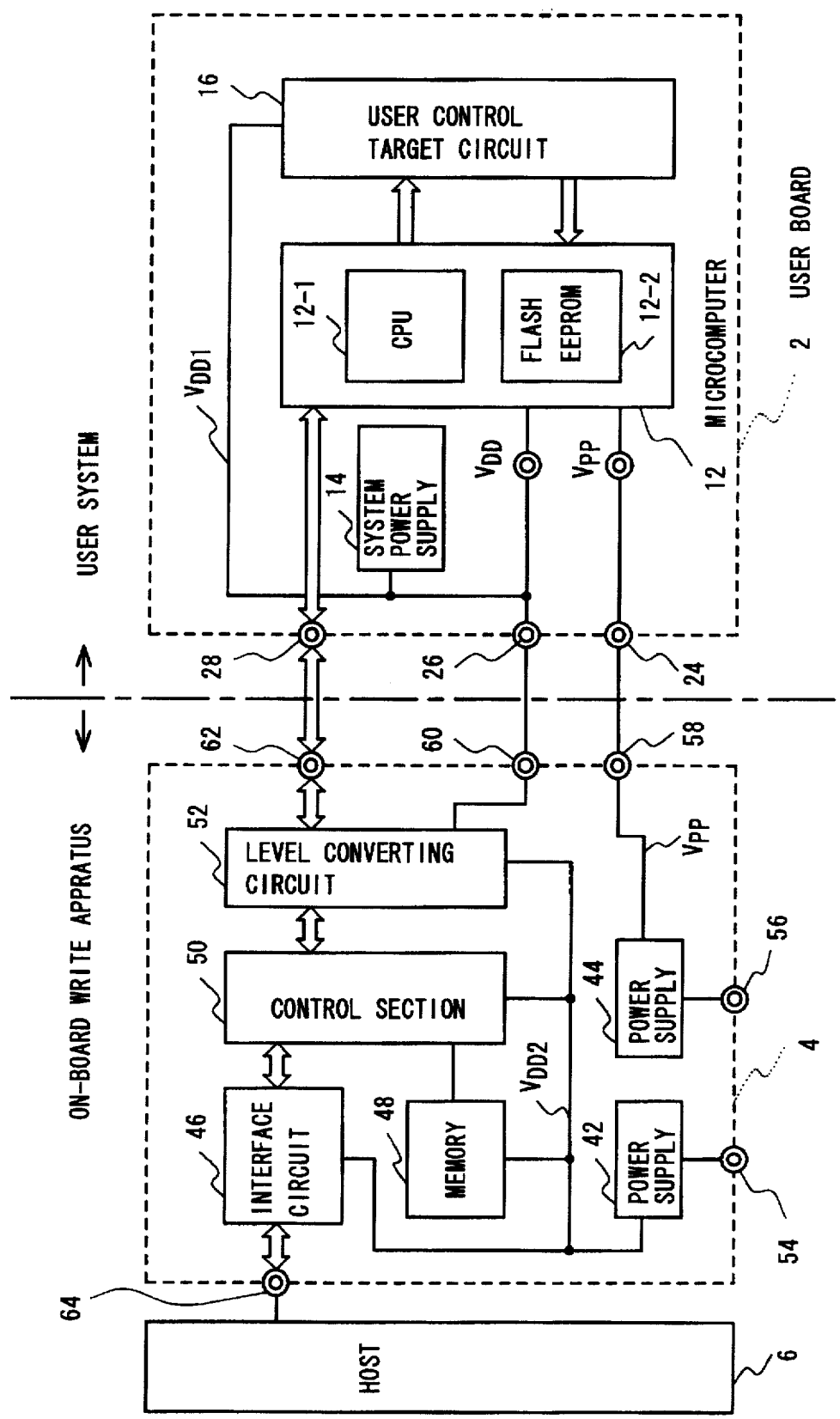
FIG. 2 is a block diagram of an on-board write apparatus to a user microcomputer board according to an embodiment of the present invention.

FIG. 2 is a block diagram of the on-board write apparatus to a user microcomputer board. Referring to FIG. 2, the on-board write apparatus is composed of an interface section 4 and a host section 6 including a host computer (not shown). The interface section 4 is composed of power supply units 42 and 44, a communication interface circuit 46, a memory 48, a control section 50, and a level converting circuit 52. The power supply unit 42 is connected to a power source (not shown) via a terminal 54 to supply a power supply voltage $V_{DD2}$ of 5 V to the communication interface circuit 46, memory 48, control section 50, and the level converting circuit 52. The power supply unit 44 is connected to the power source (not shown) via the terminal 56 to supply a power supply voltage $V_{PP}$ of 12 V to a voltage output terminal 58. The communication interface circuit 46 connected to the host section 6 via a terminal 64 and the control section 50. The circuit 46 interfaces for communication between the interface section 4 and the host section 6. Buses between the host section 6 and the communication interface circuit 46 and between the communication interface circuit 46 and the control section 50 are parallel buses. The memory 48 connected to the control section 50 stores a program and data. The control section 50 is connected to the level converting circuit 52 in addition to the communication interface circuit 46 and memory 48. The control section 50 controls the various sections of the interface section 4. Also, the control section 50 reads the program from the memory 48 and controls the communication interface circuit 46 and the level converting circuit 52 such that a data or program is transferred from the host section 6 to the user board 2. In this case, the control section 50 outputs to the data or program in a bit serial manner.

The user board 2 is composed of a microcomputer 12 including a CPU 12-1 and flash EEPROM 12-2, a system power supply unit 14, and a user control target circuit 16 which is a circuit to be controlled by the microcomputer 12 based on a program stored in the flash EEPROM 12-2. The system power supply unit 14 generates a power supply voltage having an arbitrary value in a range of 2 V to 5.5 V and supplies power to the user control target circuit 16 as the power supply voltage $V_{DD1}$ and to the microcomputer 12 as the power supply voltage $V_{DD}$. ALSO, the system power supply unit 14 supplies the power supply voltage $V_{DD}$ to the level converting circuit 52 via a voltage output terminal 26 on the user board 2 side and a voltage input terminal 60 on the interface section 4 side. The microcomputer 12 receives the power supply voltage $V_{PP}$ from the power supply unit 44 via the voltage output terminal 58 on the interface section 4 side and a voltage input terminal 24 on the user board 2 side.

The level converting circuit 52 is composed of three level converting elements, one for transmitting data from the host 6 to the microcomputer 12 of the user board 2, another for transmitting data from the microcomputer to the control circuit 50, and the remaining one for supplying a clock signal from the interface section 4 to the microcomputer 12.

Figure 3A:
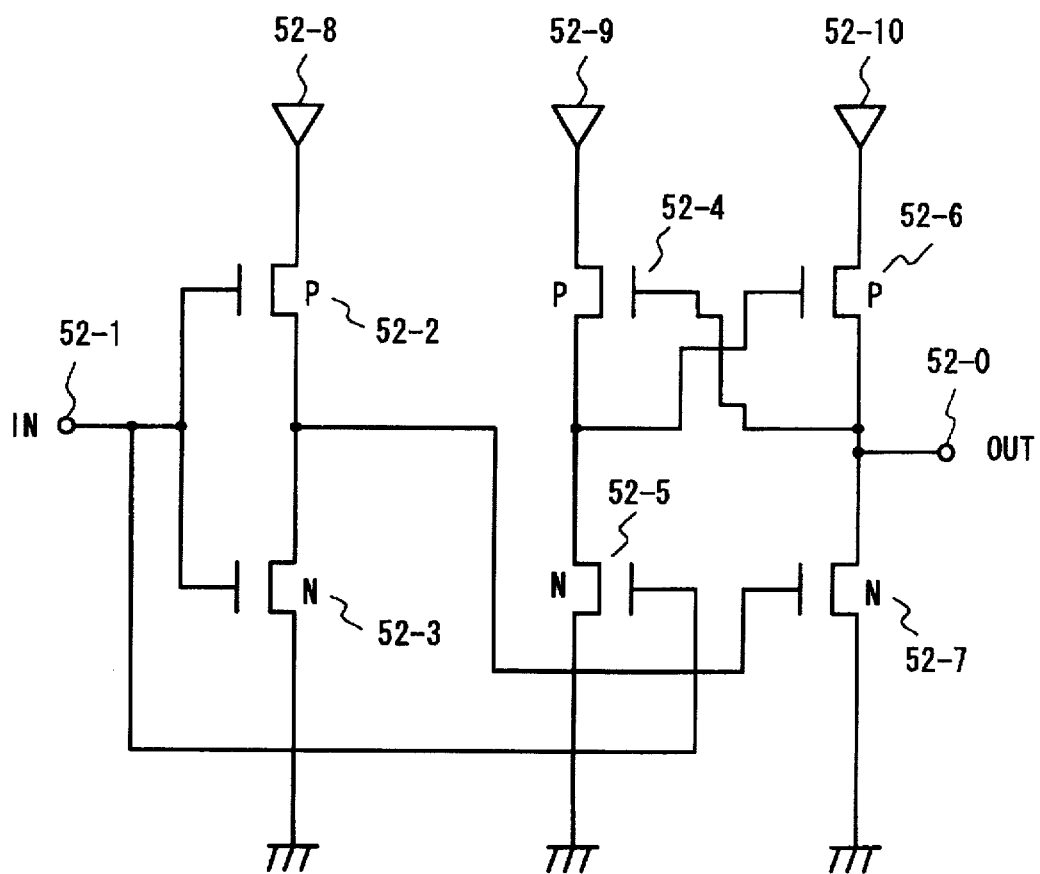
FIGS. 3A and 3B are block diagrams of two examples of level converting circuit used in the on-board write apparatus shown in FIG. 2.

FIG. 3A is a block diagram of an example of a level converting element of the circuit 52. Referring to FIG. 3A, the level converting element is composed of an inverter which is constituted of a p-channel FET 52-2 and an n-channel FET 52-3 and an RS flip-flop which is constituted of p-channel FETs 52-4 and 52-6 and n-channel FETs 52-5 and 52-7. A terminal 52-1 is connected to a signal input terminal and a terminal 52-0 is connected to a signal output terminal. That is, in a case where data is to be transmitted from the control section 50 to the microcomputer 12, the terminal 52-1 is connected to the control section 50 and the terminal 52-0 is connected to the microcomputer 12 via the terminal 62 on the interface section 4 side and the terminal 28 on the user board 2 side.

Next, the operation of the data write apparatus will be described. In order to write data or a program into the flash EEPROM 12-2 from the host section 6, three terminal pairs 62 and 28; 60 and 26, and 58 and 24 are first connected. As a result, the voltage $V_{PP}$ of 12 V is supplied to the microcomputer 12 via the terminals 58 and 24. Also, the voltage $V_{DD}$ is supplied from the system power supply 14 to the terminals 52-9 and 52-10 of each level converting element of the level converting circuit 52 via the terminals 60 and 26 while the voltage $V_{DD2}$ of 5 V is supplied to the terminal 52-8 of the level converting element. The control section 50 reads a program from the memory 48 to operate based on the program. Also, the control section 50 generates a clock signal.

When receiving a data write instruction from the host section 6, the control section 50 stores in the memory 48 the data or program supplied from the host section 6 via the communication interface circuit 46 in parallel. Then, the control section 50 initializes the flash EEPROM 12-2 in the state in which a data or a program can be written in the flash EEPROM. This is performed by operations such as a prewrite operation and a preerasure operation. Such operation to the flash EEPROM is well known and the detailed description is not given herein. After the initialization, the control section 50 supplies the stored data or program to the level converting circuit 52 in a serial manner along with the clock signal. In the level converting circuit 52, the level converting element for the data signal receives the data signal at the terminal 52-1. The data signal is inverted by the inverter composed of the p-channel FET 52-2 and n-channel FET 52-3 to produce an inverted signal having the same amplitude as the input data signal. The inverted signal is supplied to the RS flip-flop circuit to produce a converted signal of the data or program having a voltage level matching to the system power supply voltage $V_{DD}$ on the user board side. Then, the converted signal is written in the flash EEPROM 12-2 using the clock signal.

Figure 3B:
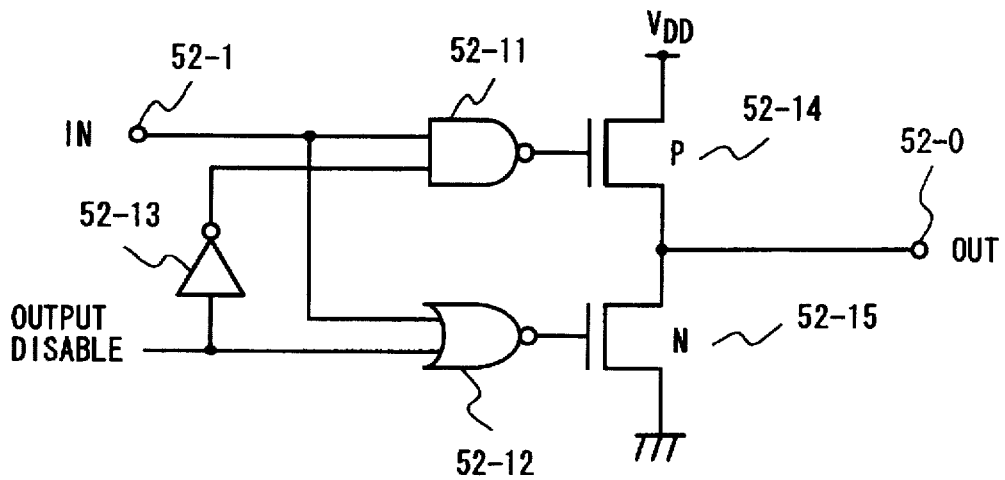

FIG. 3B is a block diagram of another example of the level converting element in the circuit 52. The level converting element is composed of an inverter 52-13, a NAND gate 52-11, a NOR gate 52-12, a p-channel FET 52-14, and an n-channel FET 52-15. The bit serial signal from the control section 50 is supplied to the terminal IN 52-1 and outputted from a terminal OUT 52-0. Also, an output disable signal is generated by the control section 50 and supplied to the level converting element. In this example, when the output disable signal is active, the output is set in a high impedance state. The operation is similar to that of FIG. 3A.

What is claimed is:

1. An apparatus for writing data into a flash electrically erasable programmable read only memory (EEPROM) built in a microcomputer which is mounted on a circuit board, comprising:

a write control section for initializing said flash EEPROM to allow data to be written in said flash EEPROM, and for supplying a data signal indicative of the data for said flash EEPROM; and a level converting section for converting a level of the data signal such that the converted data signal level matches an actual operation voltage level of said flash EEPROM and supplying the converted data signal to said flash EEPROM such that the data is written in said flash EEPROM, wherein said apparatus includes a first power supply unit for supplying a first voltage to said write control section and said level converting section, said write control section supplying the data signal based on said first voltage, said apparatus receiving a second voltage as the actual operation voltage from said circuit board, and wherein said level converting section converts the data signal level based on said first and second voltages such that the converted data signal level matches said second voltage level.

2. An apparatus according to claim 1, wherein said data signal is supplied in a bit serial manner, and wherein said level converting section includes a first level converting element for transferring the data signal and a second level converting element for transferring a clock signal, the data being written in said flash EEPROM in accordance with the clock signal.

3. An apparatus according to claim 2, wherein said write control section includes a generating section for generating a control signal, and each of said first and second level converting elements includes a three-state buffer circuit for outputting the converted data signal to said microcomputer in accordance with the control signal.

4. An apparatus for writing data into a flash electrically erasable programmable read only memory (EEPROM) built in a microcomputer which is mounted on a circuit board, comprising:

a write control section for initializing said flash EEPROM to allow data to be written in said flash EEPROM, and for supplying a data signal indicative of the data for said flash EEPROM; and a level converting section for converting a level of the data signal such that the converted data signal level matches an actual operation voltage level of said flash EEPROM and supplying the converted data signal to said flash EEPROM such that the data is written in said flash EEPROM, wherein said data signal is supplied in a bit serial manner, and wherein said level converting section includes a first level converting element for transferring the data signal and a second level converting element for transferring a clock signal, the data being written in said flash EEPROM in accordance with the clock signal.

5. An apparatus according to claim 4, wherein said first level converting element includes an inverter for inverting the data signal with the same amplitude and an RS flip-flop for converting the inverted data signal into the converted data signal with the converted data signal level matching the actual operation voltage level of said flash EEPROM.

6. In a data write system comprising a data write apparatus and a circuit board which includes a microcomputer in which a flash electrically erasable programmable read only memory (EEPROM) is provided, a method of writing data into said flash, comprising the steps of:

by said data write apparatus, generating a first voltage such that said first voltage is supplied to said microcomputer in said circuit board;

on said circuit board, generating a second voltage to supply said second voltage to said microcomputer on said circuit board;

by said data write apparatus, generating a third voltage such that said third voltage is supplied to a level converting section in said data write apparatus;

supplying the second voltage from said circuit board to said level converting section of said data write apparatus;

by said data write apparatus, initializing said flash EEPROM;

by said data write apparatus, generating a data signal indicative of the data for said flash EEPROM based on said third voltage;

by said level converting section, converting a level of the data signal from the third voltage level to the second voltage level; and by said data write apparatus, writing the data in said flash EEPROM on said circuit board with said second voltage level.

7. A method of writing data into a flash electrically erasable programmable read only memory (EEPROM) built in a microcomputer which is mounted on a circuit board, comprising the steps of:

supplying first and second voltages to the microcomputer, the second voltage being generated in the circuit board;

supplying the second voltage to a level converting section of a data write apparatus;

initializing said flash EEPROM to allow data to be written in said flash EEPROM;

generating a data signal indicative of the data for said flash EEPROM based on a third voltage; and in said level converting section, converting a level of the data signal from the third voltage level to the second voltage level to write the data in said flash EEPROM, wherein the data signal is a bit serial signal, and wherein said converting step includes:

inverting the data signal with the same amplitude; and converting the inverted data signal into the data signal with the second voltage level.

8. A method of writing data into a flash electrically erasable programmable read only memory (EEPROM) built in a microcomputer which is mounted on a circuit board, comprising the steps of:

supplying first and second voltages to the microcomputer, the second voltage being generated in the circuit board;

supplying the second voltage to a level converting section of a data write apparatus;

initializing said flash EEPROM to allow data to be written in said flash EEPROM;

generating a data signal indicative of the data for said flash EEPROM based on a third voltage;

in said level converting section, converting a level of the data signal from the third voltage level to the second voltage level to write the data in said flash EEPROM, wherein said data signal is a bit serial signal, and wherein said converting step includes:

generating a control signal; and outputting the data signal to said flash EEPROM in accordance with the control signal.

9. A method of writing data from a data write apparatus into a memory provided on a circuit board, comprising the steps of:

providing a first voltage on said data write apparatus;

supplying a data signal on said data write apparatus, a first level of said data signal corresponding to said first voltage;

receiving a second voltage on said data write apparatus from the circuit board;

converting the first level of said data signal, in accordance with the first voltage and the second voltage, to provide a converted data signal with a second level which corresponds to the second voltage;

supplying the converted data signal to the memory on the circuit board.

10. A method according to claim 9, wherein the data signal is a bit serial signal, and wherein said converting step includes:

inverting the data signal to provide an inverted data signal; and converting the inverted data signal to provide the converted data signal with the second level which corresponds to the second voltage.

11. A method according to claim 9, wherein said data signal is a bit serial signal, and wherein said converting step includes:

generating a control signal; and outputting the converted data signal to said memory in accordance with the control signal.

* * * * *